(12) United States Patent
Jeon et al.

(10) Patent No.: US 8,756,804 B2
(45) Date of Patent: Jun. 24, 2014

(54) METHOD OF MANUFACTURING PRINTED CIRCUIT BOARD

(75) Inventors: Hyung Jin Jeon, Gyunggi-do (KR); Young Do Kweon, Seoul (KR); Seung Wook Park, Gyunggi-do (KR); Seon Hee Moon, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 202 days.

(21) Appl. No.: 13/213,984

(22) Filed: Aug. 19, 2011

(65) Prior Publication Data

US 2012/0073870 A1    Mar. 29, 2012

Related U.S. Application Data

(63) Continuation-in-part of application No. 12/894,002, filed on Sep. 29, 2010.

(51) Int. Cl.
*H01K 3/10* (2006.01)

(52) U.S. Cl.
USPC .................. 29/852; 29/825; 29/846; 29/851; 216/13; 216/17; 216/18

(58) Field of Classification Search
USPC ........ 29/852, 825, 830, 846, 851; 216/13, 17, 216/18; 257/686, 707, 779, 781, E23.062, 257/E23.067, E23.069
See application file for complete search history.

(56) References Cited

U.S. PATENT DOCUMENTS

| 4,715,117 | A | 12/1987 | Enomoto |
| 6,993,836 | B2 | 2/2006 | Takenaka et al. |
| 7,091,589 | B2 | 8/2006 | Mori et al. |
| 7,524,429 | B2 * | 4/2009 | Hsu et al. .................. 216/18 |
| 2003/0137815 | A1 | 7/2003 | Ochi et al. |
| 2004/0231151 | A1 | 11/2004 | Nakatani et al. |
| 2006/0237855 | A1 * | 10/2006 | Kroehnert et al. ............ 257/779 |

FOREIGN PATENT DOCUMENTS

| JP | 2001-144398 | 5/2001 |
| JP | 2002-064270 | 2/2002 |
| JP | 2003-249587 | 9/2003 |
| JP | 2005-26313 | 1/2005 |
| JP | 2005-056924 | 3/2005 |
| JP | 2007-042666 | 2/2007 |
| JP | 2008-85308 | 4/2008 |
| KR | 1020080061816 | 7/2008 |

OTHER PUBLICATIONS

Office Action from counterpart Korean Patent Application No. 10-2011-0062517, mailed Jun. 1, 2012, 6 pages including English Summary.

(Continued)

*Primary Examiner* — Thiem Phan
(74) *Attorney, Agent, or Firm* — Bracewell & Giuliani LLP; Brad Y. Chin

(57) ABSTRACT

Disclosed is a printed circuit board, including a base member, an insulating layer formed on each of both surfaces of the base member so that the surfaces of the base member are flattened, a circuit layer formed on the insulating layer, and a via for connecting the circuit layer formed on one surface of the base member with the circuit layer formed on the other surface of the base member. A method of manufacturing the printed circuit board is also provided.

5 Claims, 4 Drawing Sheets

(56) References Cited

OTHER PUBLICATIONS

Office Action from counterpart Korean Patent Application No. 10-2011-0062517, mailed Dec. 18, 2012, 7 pages, English Summary included.

Office Action from counterpart Japanese Patent Application No. 2011-154410, mailed Dec. 11, 2012, 4 pages, English Summary included.

Korean Office Action dated Aug. 6, 2013 for Korean Application No. 10-0068162.

* cited by examiner

METHOD OF MANUFACTURING PRINTED CIRCUIT BOARD

CROSS REFERENCE TO RELATED APPLICATION

The present application is a continuation in part of, and claims the benefit of U.S. patent application Ser. No. 12/894,002, filed on Sep. 29, 2010 entitled "PRINTED CIRCUIT BOARD AND METHOD OF MANUFACTURING THE SAME", which claims the benefit of Korean Patent Application No. 10-2010-0068162, filed Jul. 14, 2010, entitled "PRINTED CIRCUIT BOARD AND MANUFACTURING METHOD THEREOF", which is hereby incorporated by reference in its entirety into this application.

BACKGROUND OF THE INVENTION

1. Technical Field

The present invention relates to a printed circuit board and a method of manufacturing the same.

2. Description of the Related Art

Printed circuit boards (PCBs), which are responsible for signal transmission, power supply, etc., using electrical connections between electronic components, have been developed towards the fineness of active devices and semiconductor components and the fabrication of electronic products which are lightweight, slim, short and small, rather than being developed independently.

Conventional PCBs are provided in the form of multilayered PCBs by repetitively stacking insulating and circuit layers on a core layer having a circuit layer. In the typical formation of multilayered PCBs, locating an insulating layer at an accurate position and forming a circuit layer adapted for the requirements made thereof are regarded as important when determining the reliability of the PCB. To this end, an align key is formed on the PCB and is used together with a device for recognizing the align key to perform a build-up process.

Also, alongside recent trends in the electronics industry are the demands for rapidly and inexpensively manufactured products which are lightweight and small and have multifunctionality and high reliability. One of the important methods enabling this is the packaging technique. The packaging technique uses an interposer board in order to achieve a three-dimensional structure and a small size.

A conventional interposer board includes a semiconductor wafer (Si wafer) serving as a core layer. The interposer board is formed by performing grinding to control the thickness of the supplied Si wafer, forming a through hole, performing an oxidizing process to form an oxide insulating layer on the outer surface of the wafer and on the inner wall of the through hole, and performing a plating process to form a via and a redistribution layer. As such, the redistribution layer may be formed to have a multilayer structure using a typical build-up process.

However, the Si interposer board thus manufactured is disadvantageous because expensive materials are used and the semiconductor process is employed, undesirably complicating the manufacturing process, resulting in lowered productivity.

SUMMARY OF THE INVENTION

Accordingly, the present invention has been made keeping in mind the problems encountered in the related art and the present invention is intended to provide a PCB which includes a base member made of a ceramic material or an organic material, and an insulating layer formed on a surface of the base member so that the surface of the base member is flattened to thus facilitate the recognition of an align key formed on the base member.

Also, the present invention is intended to provide a method of manufacturing the PCB.

An aspect of the present invention provides a PCB, including a base member, an insulating layer formed on each of both surfaces of the base member so that the surfaces of the base member are flattened, a circuit layer formed on the insulating layer, and a via for connecting the circuit layer formed on one surface of the base member with the circuit layer formed on the other surface of the base member.

In this aspect, the base member may include a ceramic material or an organic material.

In this aspect, the PCB may further include a protection layer formed on the circuit layer.

In this aspect, the circuit layer may include a pad exposed to the outside and a pad protection layer formed on the pad.

In this aspect, the circuit layer may have a multilayer structure.

In this aspect, the protection layer may have an opening for exposing the pad of the circuit layer or the via.

Furthermore, the opening may be subjected to rounding treatment so as to be imparted with a shape which has a diameter that increases as the opening becomes more distant from the base member.

Furthermore, the protection layer may be formed by means of a photoresist using a liquid photodefinable material, and the opening of the protection layer may be formed using photo-exposure and development.

Furthermore, a thickness from one surface of the circuit layer in contact with the protection layer to an exposed surface of the protection layer may be 15 µm or less.

Another aspect of the present invention provides a method of manufacturing a PCB, including providing a base member, forming an insulating layer on each of both surfaces of the base member, forming a through hole in the base member, forming a via in the through hole, and forming a circuit layer on each of both surfaces of the base member so that the circuit layer formed on one surface of the base member and the circuit layer formed on the other surface of the base member are connected with each other using the via.

In this aspect, the base member may include a ceramic material or an organic material.

In this aspect, the method may further include forming a protection layer for covering the circuit layer, after forming the circuit layer.

In this aspect, the protection may have an opening for exposing the pad of the circuit layer or the via.

Furthermore, the opening may be subjected to rounding treatment so as to be imparted with a shape which has a diameter that increases as the opening becomes more distant from the base member.

Furthermore, the protection layer may be formed by means of a photoresist using a liquid photodefinable material, and the opening of the protection layer may be formed using photo-exposure and development.

In this aspect, the protection layer may be formed so that a pad of the circuit layer is exposed, and the method may further include forming a pad protection layer on the pad.

In this aspect, forming the via and forming the circuit layer may be simultaneously performed using plating.

BRIEF DESCRIPTION OF THE DRAWINGS

The features and advantages of the present invention will be more clearly understood from the following detailed description taken in conjunction with the accompanying drawings, in which.

DESCRIPTION OF SPECIFIC EMBODIMENTS

Figure 1:
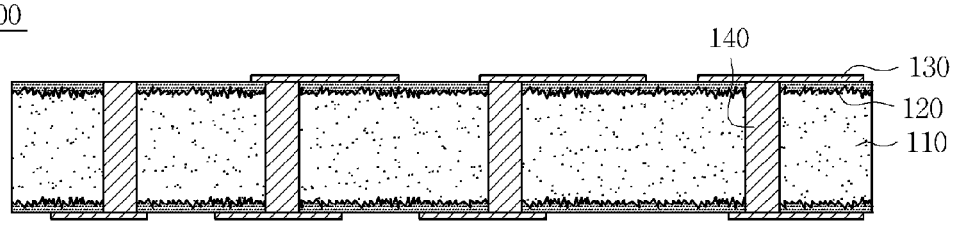
FIG. 1 is a cross-sectional view schematically showing a PCB according to an embodiment of the present invention.

Hereinafter, embodiments of the present invention will be described in detail while referring to the accompanying drawings. Throughout the drawings, the same reference numerals are used to refer to the same or similar constituents. Furthermore, descriptions of known techniques, even if they are pertinent to the present invention, are regarded as unnecessary and may be omitted in so far as they would make the characteristics of the invention unclear.

Furthermore, the terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept implied by the term to best describe the method he or she knows for carrying out the invention.

Figure 2:
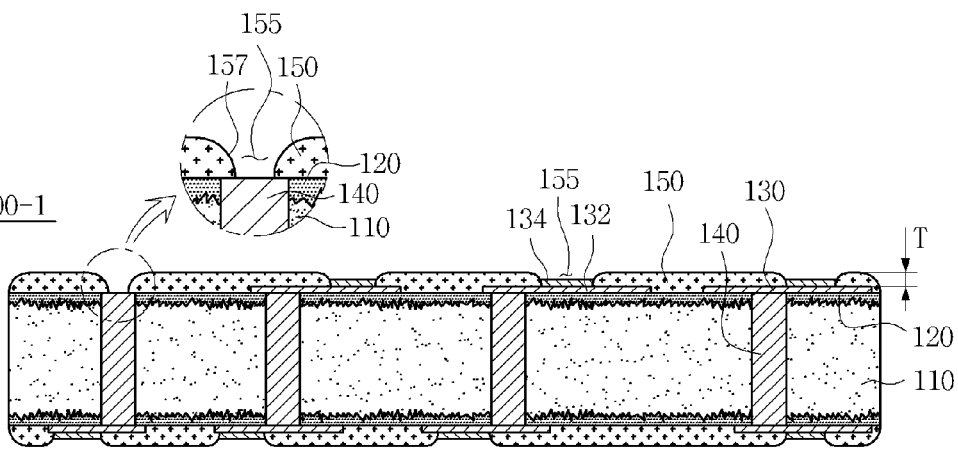
FIGS. 2 and 3 are cross-sectional views schematically showing modifications of the PCB of FIG. 1.
Figure 3:
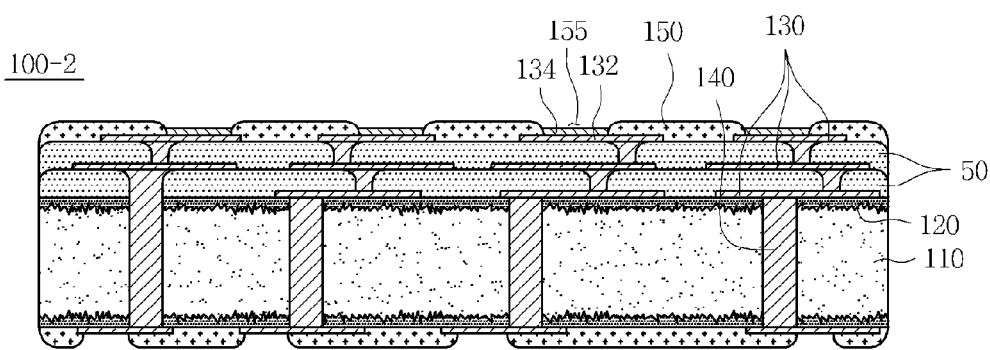

FIG. 1 is a cross-sectional view schematically showing a PCB according to an embodiment of the present invention, and FIGS. 2 and 3 are cross-sectional views schematically showing modifications of the PCB of FIG. 1. With reference to these drawings, the PCB according to the present embodiment is described below.

As shown in FIG. 1, the PCB 100 includes a base member 110 made of an organic or ceramic material. Whereas a conventional interposer board includes a Si wafer, the PCB 100 according to the present invention uses the above material and thus may further reduce the material cost when used as an interposer board.

The base member 110 of organic material includes a plastic resin, such as a phenol resin, an epoxy resin, or an imide resin, and reduces changes in dimension depending on strength and temperature using a reinforcing material such as glass fiber or paper. In addition, the base member 110 of ceramic material includes a non-metal solid or an inorganic material such as alumina ($Al_2O_3$), and has very low electrical conductivity and is more resistant to high temperature compared to when the organic material is used.

The base member 110 typically has a planar rectangular shape, but the shape thereof is not limited thereto and may vary.

Also, insulating layers 120 are respectively formed on both surfaces of the base member 110 so that the surfaces of the base member 110 are flattened. A typical base member 110 having surface roughness is problematic because it decreases reliability upon formation of a circuit layer and makes it difficult to recognize an align key. More specifically, when a circuit layer is formed using an etching process, in the case of the base member 110 having surface roughness, excessive etching may be performed in order to prevent adjacent circuit patterns from shorting out, undesirably increasing defects (non-uniform circuit patterns) of the circuit layer. Also, when the align key is recognized using IR light and then photo-exposure and development or stacking is performed, the surface roughness hinders the recognition of the align key.

The insulating layers 120 function to flatten the surfaces of the base member 110 to thus offset the surface roughness, thereby solving the above problems. As such, the insulating layers 120 are provided in the form of a thin film and are made of an organic material.

Also, circuit layers 130 are respectively formed on the insulating layers 120. Because the insulating layers 120 are formed on both surfaces of the base member 110, the circuit layers 130 may also be formed on both surfaces of the base member 110. Accordingly, the PCB 100 may electrically connect a main circuit board on which the corresponding PCB is mounted, with an electronic device mounted on the corresponding PCB. As such, the circuit layers 130 are formed using a typical plating process, and are made of a conductive material such as copper.

In particular, in the case where the PCB 100 according to the present invention is used as an interposer board, the circuit layers 130 function as a redistribution layer.

Also, vias 140 function to connect the circuit layers 130 formed on both surfaces of the base member 110. The vias 140 may be typically formed by forming through holes 115 in the base member 110 and then performing plating, and the structure and shape of the vias 140 may be easily modified.

In addition, a PCB 100-1 as shown in FIG. 2 further includes protection layers 150 formed on the circuit layers 130. The protection layers 150 function to prevent the oxidation of the circuit layers 130. The protection layers 150 may include a photoresist (PR) using a liquid photodefinable material. The liquid photodefinable material may include a resin such as hydroxystyrene, epoxy, acryl, etc., a photosensitive crosslinker, and a solvent, but the present invention is not necessarily limited thereto and any photosensitive material known in the art may be used. When the protective layers 150 are formed by means of PR using the liquid photodefinable material in this way, the thickness T from one surface of the circuit layer 130 in contact with the protection layer 150 to the exposed surface of the protection layer 150 may be formed to 15 μm or less, which is much thinner compared to conventional techniques.

As such, openings 155 may be formed in the protection layers 150 so that pads 132 for mounting an electronic device are exposed to the outside. Furthermore, the openings 155 of the protection layers 150 may be formed so as to expose the vias 140 to the outside, in addition to the pads 132 (an enlarged view of FIG. 2). As such, the openings 155 of the protection layers 150 may be formed using photo-exposure and development, and the specific formation process thereof is described later.

Also, the openings 155 of the protection layers 150 may be subjected to rounding treatment 157 so as to be imparted with a shape which has a diameter that increases as an opening becomes more distant from the base member 110 (an enlarged view of FIG. 2). When the openings 155 of the protection layers 150 are subjected to rounding treatment 157 in this way, upon forming a seed layer using a sputter, the seed layer may be deposited on portions subjected to rounding treatment 157 even if a material having linearity is emitted perpendicular to the protection layers 150 from the sputter.

The pads 132 function as connectors on which bumps are located when the electronic device is mounted on the PCB 100-1 or when the PCB 100-1 is mounted on another circuit board.

Also, pad protection layers 134 may be further formed on the pads 132. The pad protection layers 134 function to protect the pads 132 exposed to the outside from being oxidized, and to improve the solderability of components and conductivity. The pad protection layers 134 may be made of a metal having low corrosivity and high conductivity, such as tin, silver or gold.

In addition, the circuit layer 130 of a PCB 100-2 as shown in FIG. 3 may have a multilayer structure formed by repetitively stacking insulating layers 50 and circuit layers. In particular, in the case where the PCB 100 according to the present invention is used as an interposer board, the circuit layer 130 functions as a redistribution layer, and thus enables a wiring structure to vary depending on the needs thanks to the formation of the multilayer structure. On the other hand, the insulating layers 50 may be formed by means of PR using a liquid photodefinable material, like the protection layers 150. Furthermore, via holes that perforate the insulating layers 50 may be subjected to rounding treatment so as to be imparted with a shape which has a diameter that increases as it becomes more distant from the base member 110, as in the openings 155 of the protection layers 150.

With reference to FIGS. 4 to 13, a method of manufacturing the PCB according to the embodiment of the present invention is described below.

Figure 4:
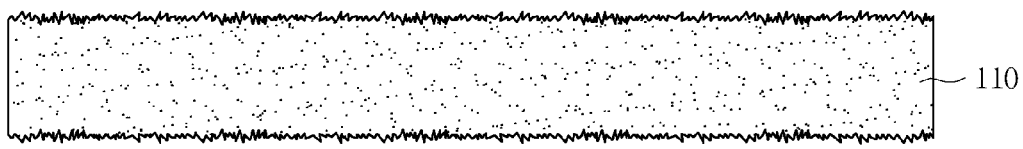
FIGS. 4 to 13 are cross-sectional views schematically showing a process of manufacturing the PCB of FIGS. 1 to 3.

As shown in FIG. 4, a base member 110 is provided. The base member 110 constitutes a core layer of the PCB 100, and may be made of an organic or ceramic material.

Figure 5:
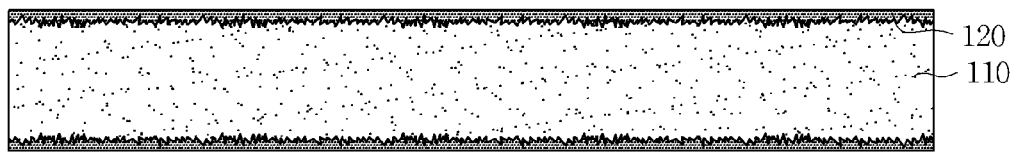

Next, as shown in FIG. 5, insulating layers 120 are respectively formed on both surfaces of the base member 110. The insulating layers 120 are formed using an organic material (e.g. a plastic resin) or a ceramic material. As such, roller coating, curtain coating, or spray coating may be applied. The insulating layers 120 thus formed may offset the surface roughness caused by irregularities, thus forming flattened surfaces.

Figure 6:
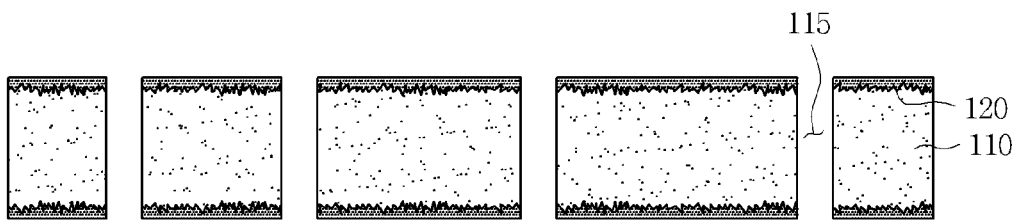

Next, as shown in FIG. 6, through holes 115 are formed in the base member 110. As such, mechanical drilling using a drill bit or laser machining using a YAG laser or a $CO_2$ laser may be utilized.

Figure 7:
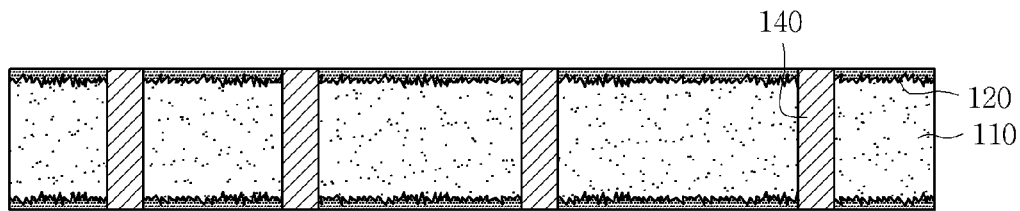

Next, vias 140 are formed in the through holes 115. As shown in FIG. 7, the through holes 115 may be filled with a conductive material, thus forming the vias 140, or alternatively, plated vias 140 may be formed on the inner walls of the through holes 115 using electroless copper plating and copper electroplating.

Figure 8:
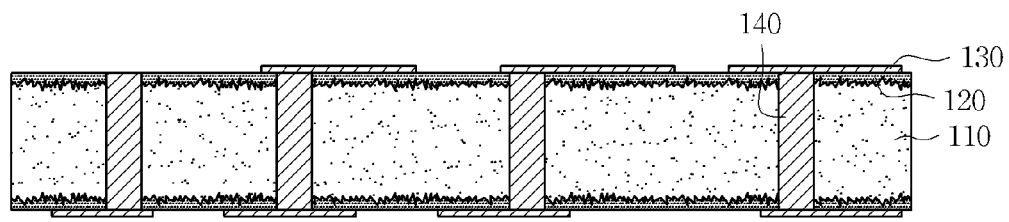

Next, as shown in FIG. 8, circuit layers 130 are respectively formed on both surfaces of the base member 110 so that they are connected using the vias 140. Specifically, plating layers (which are formed on the insulating layers) are formed on both surfaces of the base member 110, master films are laminated thereon, photo-exposure and development are performed, and then etching is performed, thus forming the circuit layers 130.

Figure 9:
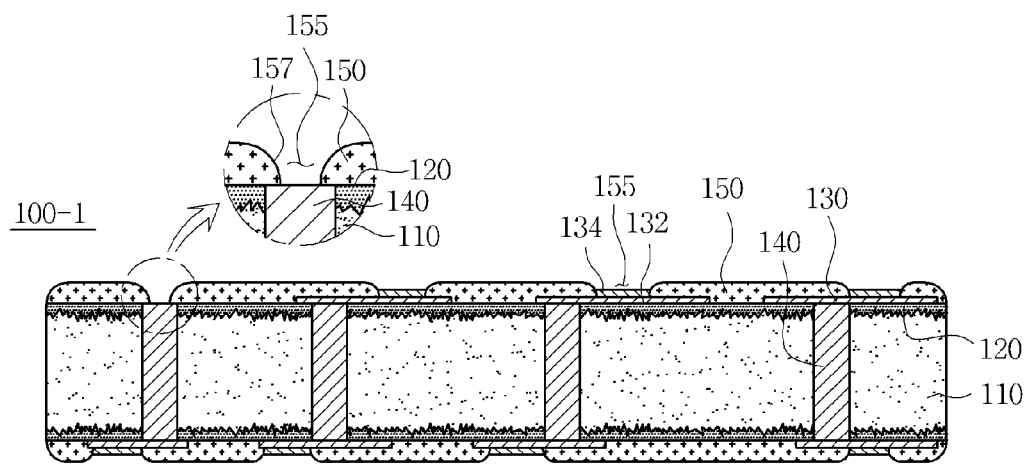

In addition, as shown in FIG. 9, protection layers 150 are formed to cover the circuit layers 130, and openings 155 for exposing the pads 132 or the vias 140 are formed in the protection layers 150.

Specifically in the formation of the protection layers 150, PR using a liquid photodefinable material is applied on the insulating layers 120, and prebaked at 60~150° C. for 1~10 minutes, after which photo-exposure for radiating light onto portions (positive type PR) where openings 155 will be formed or the other portions (negative type PR) depending on the kind of PR is carried out. Subsequently, development is performed so that the portions where the openings 155 will be formed are dissolved and removed. Finally, curing is performed at 180~250° C. for a period of time ranging from 30 minutes to 2 hours thus completing the protection layers 150.

However, this process of forming the protection layers 150 is merely illustrative, and the scope of the present invention is not limited thereto.

The openings 155 of the protection layers 150 may be formed into various shapes depending on the process conditions (temperature, time, photo-exposure amount, etc.) including prebaking, photo-exposure, and development. In particular, the openings 155 may be subjected to rounding treatment 157 so as to be imparted with a shape which has a diameter that increases as an opening becomes more distant from the base member 110 while shrinking the resin of the liquid photodefinable material in the curing process (an enlarged view of FIG. 9).

As such, the formation of pad protection layers 134 for protecting the pads exposed to the outside may be further performed, and may be carried out using an outer-surface treatment process such as hot air solder leveling (HASL), pre-flux coating, or electroless gold plating. Alternatively, under bump metallization (UBM) may be adopted as the pad protection layers 134. As such, UBM may include a wetting layer bound to bumps on which electronic devices are mounted, a barrier layer for preventing the diffusion of bumps to the pads 132, and an adhesion layer for enhancing adhesion between the bumps and the pads 132.

In addition, a method of manufacturing a PCB according to another embodiment of the present invention enables vias 140 and circuit layers 130 connected using the vias 140 to be simultaneously formed using plating. With reference to FIGS. 10 to 13, the method of manufacturing the PCB according to the present embodiment is described below.

Figure 10:
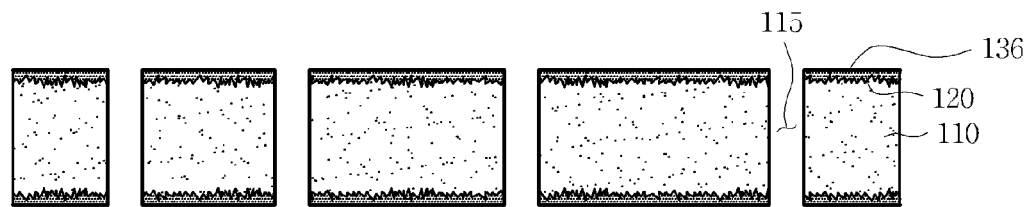

As shown in FIG. 10, a seed layer 136 is formed on a base member 110 having through holes 115 formed therein. The seed layer 136 is formed on the inner walls of the through holes 115 and on the insulating layers 120 using electroless copper plating. The electroless copper plating may be performed using a precipitation reaction in the presence of a catalyst composed of a palladium-tin compound in order to plate the surface of a non-conductor such as the organic material or the ceramic material.

Figure 11:
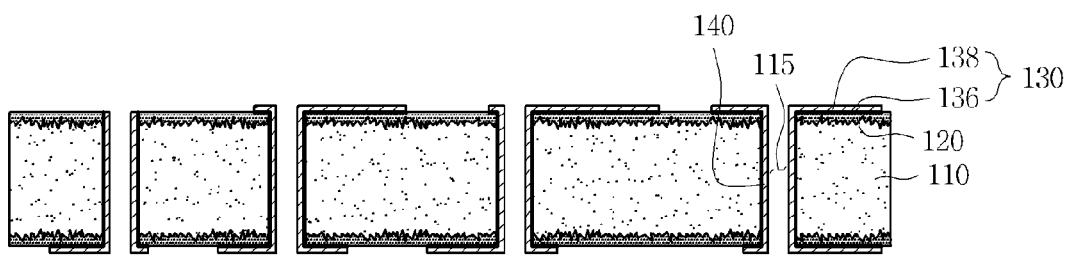

Next, as shown in FIG. 11, a plating layer 138 is formed, and then the seed layer 136 and the plating layer 138 are patterned. The plating layer 138 is identically formed on the seed layer 136 using copper electroplating. Furthermore, patterning is performed using a master film (an etching resist film) and an etchant.

As such, in order to protect the seed layer 136 and the plating layer 138 formed on the inner walls of the through holes 115, a hole filling process for filling through holes with ink or a tenting process using a master film may be applied (a panel plating process).

Figure 12:
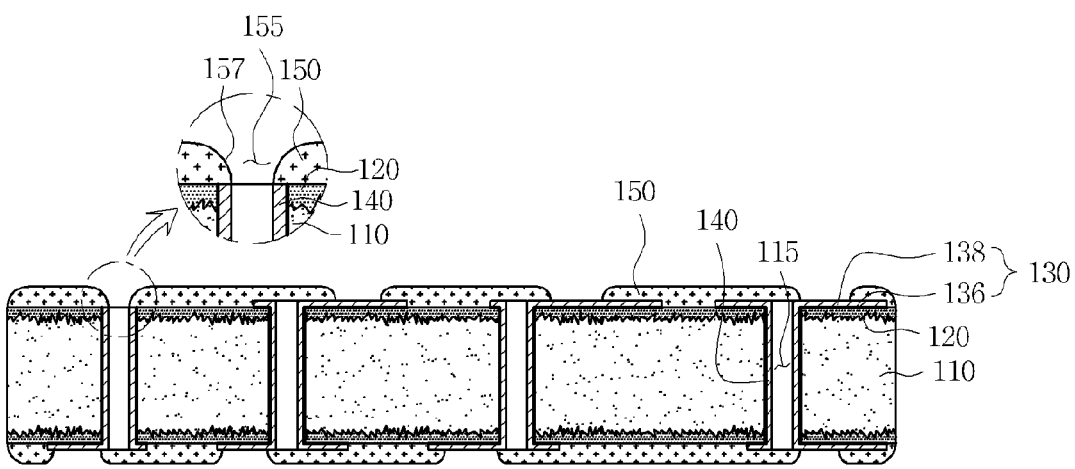
Figure 13:
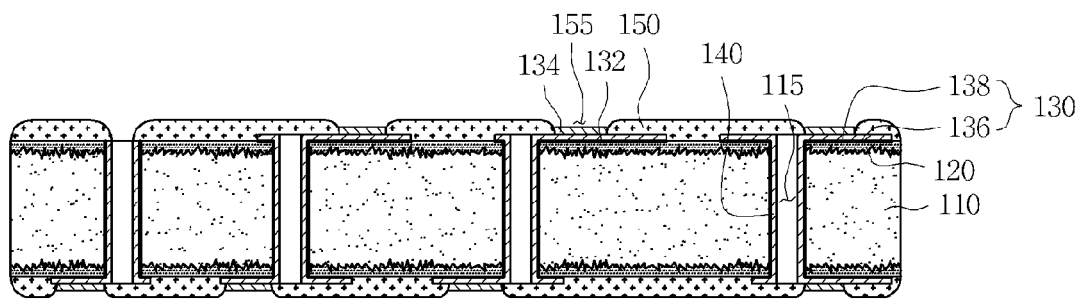

Next, as shown in FIGS. 12 and 13, protection layers 150 are formed, and pad protection layers 134 may be further formed on the pads 132.

As mentioned above with reference to FIGS. 10 to 13, the vias and the circuit layers may be simultaneously formed and thus the manufacturing process becomes simplified, resulting in increased productivity. Also, in order to simultaneously form the vias and the circuit layers, a patterning plating process which includes performing electroless plating, forming a plating resist and then selectively forming a plating layer may be applied to the present embodiment, in addition to the panel plating process using the hole filling process or the tenting process.

In addition, a PCB 100-2 as shown in FIG. 3 is configured such that a circuit layer 130 formed on one surface of a base member 110 has a multilayer structure. Such a PCB 100-2 may be manufactured by forming a single circuit layer on the base member 110 as mentioned above with reference to FIG. 8, and then repeating (a build-up process) the formation of an insulating layer and the formation of a circuit layer.

As described hereinbefore, the present invention provides a PCB and a method of manufacturing the same. In the PCB according to the present invention, a base member made of a ceramic material or an organic material is used thus reducing the PCB production cost, and in particular, it may substitute for a Si wafer when forming an interposer board, and thereby the production cost can be further reduced.

Also, according to the present invention, the PCB is configured such that an insulating layer is formed on the base member thus flattening the surface of the base member, and thereby an align key formed on the base member can be accurately recognized. Therefore, a build-up process can be efficiently carried out, and the reliability of a circuit layer is increased. In the case of the interposer board, the formation of a redistribution layer is easy.

Also, according to the present invention, because the PCB includes the base member made of a ceramic material or an organic material, a typical build-up process can be utilized in lieu of a conventional semiconductor process, thereby shortening the manufacturing time and increasing the productivity.

Although the embodiments of the present invention have been disclosed for illustrative purposes, those skilled in the art will appreciate that a variety of different modifications, additions and substitutions are possible, without departing from the scope and spirit of the invention as disclosed in the accompanying claims. Accordingly, such modifications, additions and substitutions should also be understood as falling within the scope of the present invention.

What is claimed is:

1. A method of manufacturing a printed circuit board, comprising:
    providing a base member;
    forming an insulating layer on each of both surfaces of the base member;
    forming a through hole in the base member;
    forming a via in the through hole;
    forming a circuit layer on each of both surfaces of the base member so that the circuit layer formed on one surface of the base member and the circuit layer formed on the other surface of the base member are connected with each other using the via; and
    forming a protection layer for covering the circuit layer,
    wherein the protection layer has an opening for exposing the pad of the circuit layer or the via and is formed by means of a photoresist using a liquid photodefinable material,
    wherein the opening of the protection layer is formed through photo-exposure and development processes and is subjected to rounding treatment so as to be imparted with a shape which has a diameter that increases as the opening becomes more distant from the base member by using a prebaked process at 60-150° C. for 1-10 minutes and, after the photo-exposure process, a curing at 180-250° C. for a period of time ranging from 30 minutes to 2 hours, and
    wherein the insulating layer serves to flatten the surfaces of the base member by offsetting the surface roughness.

2. The method as set forth in claim 1, wherein the base member comprises a ceramic material or an organic material.

3. The method as set forth in claim 1, wherein the protection layer is formed by means of a photoresist using a liquid photodefinable material, and the opening of the protection layer is formed using photo-exposure and development.

4. The method as set forth in claim 1, wherein the protection layer is formed so that a pad of the circuit layer is exposed, and which further comprises forming a pad protection layer on the pad.

5. The method as set forth in claim 1, wherein the forming the via and the forming the circuit layer are simultaneously performed using plating.

* * * * *